US007738306B2

(12) United States Patent
Shiah

(10) Patent No.: US 7,738,306 B2
(45) Date of Patent: Jun. 15, 2010

(54) METHOD TO IMPROVE THE WRITE SPEED FOR MEMORY PRODUCTS

(75) Inventor: Chun Shiah, Hsinchu (TW)

(73) Assignee: Etron Technology, Inc., Hsin-Chu (TW)

( * ) Notice: Subject to any disclaimer, the term of this patent is extended or adjusted under 35 U.S.C. 154(b) by 383 days.

(21) Appl. No.: 11/999,799

(22) Filed: Dec. 7, 2007

(65) Prior Publication Data

US 2009/0147596 A1  Jun. 11, 2009

(51) Int. Cl.
*G11C 7/00* (2006.01)
(52) U.S. Cl. .............................. 365/189.16; 365/189.09; 365/189.11; 365/205
(58) Field of Classification Search ............ 365/189.09, 365/189.11, 189.16, 205
See application file for complete search history.

(56) References Cited

U.S. PATENT DOCUMENTS 6,181,193 B1    1/2001   Coughlin, Jr.
6,661,253 B1    12/2003  Lee et al.
6,816,418 B2    11/2004  Hidaka
2002/0075741 A1* 6/2002  Chrissostomidis et al. .. 365/208
2008/0130389 A1* 6/2008  Kajitani ...................... 365/203

* cited by examiner

*Primary Examiner*—Hoai V Ho
(74) *Attorney, Agent, or Firm*—Saile Ackerman LLC; Stephen B. Ackerman

(57) ABSTRACT

A method and circuit are given, to realize a Bit-Line Sense Amplifier with Data-Line Bit Switch (BS) pass transistors for Random Access Memory (RAM) products as Integrated Circuit (IC) fabricated in CMOS technology with optimized operating characteristics of said RAM product with respect to good write stability and high write speed and wherein the layout area of the BS FET-switches and thus also the die size is minimized. This is achieved by using a two thickness technique of oxide layers for crucial internal circuit parts of the chip.

6 Claims, 4 Drawing Sheets

METHOD TO IMPROVE THE WRITE SPEED FOR MEMORY PRODUCTS

BACKGROUND OF THE INVENTION (1) Field of the Invention

The present invention relates in general to semiconductor design technology; more particularly this invention relates to the manufacture of memory Integrated Circuits (IC), and even more particularly to a semiconductor memory IC having an optimized chip area design with enhanced writing speed behavior via technologically adapted data-line selection devices in such memory circuits.

(2) Description of the Related Art

In general, electronic data storage devices built as integrated memory circuits are made up of a large number of memory cells arranged in the form of a matrix or array with rows and columns. These arrays are surrounded by a number of auxiliary elements—also called peripheral circuits—necessary for achieving the purpose of those data storage operations, i.e. writing data into and accordingly reading data from addressed memory cells within that storage device, all this under control of read/write enable and row and column address strobe signals, whereby row and column addresses are extracted from appropriately decomposing the intrinsic memory address. Confining the description to such memory circuits, which constitute the majority of cases in data storage applications, namely to Dynamic Random Access Memories (DRAMs) allows to explain more thoroughly the composition and operation of such circuits. From now on, the items designated with capital letters signify discrete tangible circuit or data elements and circuit blocks in DRAMs. Corresponding to these operations, besides said Memory Cell Array—arrayed in Rows and Columns—with additional Precharge Circuits and Sense Amplifiers (also possibly combined into common blocks) with I/O Gate functionality for the Read/Write operations from and to the Memory Cells—which plainest can be made up of a single transistor and a single capacitor and generically named as Unit Memory Cells in that specific meaning, being part of said Memory Array—the other function blocks present are Data Buffers or special Data I/O (IN/OUT or Input/Output) Driver blocks for Data Input and Data Output, Address Buffers for Memory Addresses—either conjointly or separately used for Rows and Columns, in the latter case then having separate Row Address and Column Address Buffer blocks—Row (also called Word-Line) Decoder (and Driver) blocks and Column Decoder blocks for decoding said Memory Addresses, a Peripheral Control Circuits block for Timing and Control functions also called Control Command block for processing Row and Column Address Strobe signals together with a Read/Write Enable signal for the operating of all these auxiliary blocks. The signals mentioned above as Data Input, Data Output, Memory Addresses, Row and Column Address Strobes, and Read/Write Enable are normally combined in a Data Bus, an Address Bus, and a Control Bus respectively. It shall not remain unmentioned in this context, that Unit Memory Cells for DRAMs can also be made up of three transistor circuits or even more complex configurations and that multi-transistor cells are to be used also in Static RAM arrays, which are not particularly and separately described here however.

Each of the Sense Amplifiers employed in a semiconductor memory device is kind of an amplifying circuit for sensing a microsignal, i.e. a very low voltage or current signal. As typical Sense Amplifiers are known those as Bit-Line Sense Amplifiers and as I/O Sense Amplifiers. The Bit-Line Sense Amplifier is used to sense a microsignal on a Bit-Line pair, which is produced from a Memory Cell, whereas the I/O Sense Amplifier is used to sense a signal transmitted over a Data Bus line pair and amplify it. These tasks may both be combined into operations for one single circuit with additional control elements. As these Sense Amplifiers have various implementations, there are therefore known those of a current or a voltage type, sensing primarily current differences or voltage differences, respectively. A current type Sense Amplifier is used to amplify the amplitude of the current flowing in each Bit-Line depending on a difference between currents which flow in the Bit-Line pair, and this is particularly effective when it is activated at low voltages and its amplitude is small. As the density of semiconductor memory devices increases, simultaneously the operating power supply voltages decrease thereby also reducing current and consequently also alleviating power consumption. In the case of, e.g., DRAMs implemented with CMOS technology, this narrows the range of voltages used to represent one of two binary states. It is therefore desirable to provide the most accurate possible sensing method to determine the state of a Memory Cell. Accurate amplification of voltage levels on Bit-Lines is therefore highly desirable. Due to the trend in decreasing power-supply voltages for semiconductor memory devices, it is difficult to sense the voltage difference between complementary voltage levels on a pair of Bit-Lines, even with specialized voltage type Sense Amplifiers.

In typical DRAMs, data is not directly transmitted from the Memory Cells. Rather, data is temporarily copied to said Sense Amplifiers prior to transmission. Typically, the Sense Amplifiers only store one Row of data. If an operation is to be performed on a Row of data other than the currently stored Row, two operations must be performed. The first operation is referred to as a Precharge operation, where pairs of Bit Lines within the memory are equalized to a midpoint voltage level. The second operation is referred to as a Sense operation, where the Row on which the operation is to be performed is copied onto Sense Amplifiers. Between the Precharge operation and the subsequent Sense operation, the DRAM in question is said to be in a closed state. At all other times, the DRAM is said to be in an open state. In the prior art, DRAMs are configured to determine whether Precharge and Sense operations have to be performed prior to servicing a data transfer request from a controller. Typically, the DRAM performs this determination by comparing the requested Memory Address to the current Memory Address in the DRAM bank. If the two addresses match, then the data is transmitted from the Sense Amplifiers and no Precharge or Sense operations are required. If the addresses do not match, then the DRAM performs a Precharge and Sense operation to load the Sense Amplifiers with data from the appropriate Row. In a memory for transmitting data stored in a Memory Cell to a Bit-Line Sense Amplifier through a Bit-Line pair and storing the data output from the Bit-Line Sense Amplifier a controller circuit is needed, often implemented as Column Selection circuit. The Column Selection circuit includes an Equalizer for equalizing the potentials on the pair of Bit-Lines for compensating signal voltage levels of the Bit-Line pair as a Word-Line is selected. It generates enable signals to operate the Bit-Line Sense Amplifier, which allows data to be transmitted via the Bit-Line pair from the Memory Cell to the Bit-Line Sense Amplifier, and transmitting the data output from the Bit-Line Sense Amplifier to the Data-Line pair.

Memory access to the DRAM contents typically takes place as follows. An address buffer first receives the Row Address and then the Column Address. These addresses are passed to their respective decoders, once decoded, the hereby addressed Memory Cell outputs its stored data, which is amplified by a Sense Amplifier and transferred to a Data Output Buffer by an I/O Gate. The central part of the DRAM is the Memory Cell Array, which is where the data are stored. Such a Memory Cell Array is made up of many Unit Memory Cells, each of which is usually individually addressable and used to store a single bit. Unit Memory Cells are defined by Word-Lines WLx (or Rows) and Bit-Lines BLx (or Columns). The Unit Memory Cell has a capacitor which holds the data in the form of electrical charges, and an access transistor which serves as a switch for selecting the capacitor. The transistor's gate is connected to the Word-Line WLx. The source of the access transistors are alternately connected to the Bit-Lines BLx. Adjacent Bit-Lines thus being represented as a Bit-Line pair, counting together a normal potential (BLx) line and a complementary potential (BLx-bar) line. These pairs of Bit-Lines are then evaluated together, generally by some sort of a differential amplifier called Sense Amplifier. At this level, memory access begins when a Word-Line is selected (via the decoding of a Row Address) thereby switching on all the access transistors connected to that Word-Line. In other words, all the Unit Memory Cells in that particular row are turned on. As a result, charges in the capacitor within each Unit Memory Cell are transferred onto the Bit-Lines causing a potential difference between the Bit-Lines. This potential difference is detected and amplified by a Sense Amplifier. This amplified potential difference is then transferred to the I/O Gate activated based on the Column Address, which in turn transfers the amplified signal to the Data Output Buffer. The Precharge Circuit plays a significant role in detecting memory data during the course of a memory access operation. In advance of a memory access and the activation of a Word-Line, the Precharge Circuit charges all Bit-Line pairs up to a certain potential which usually equals to half of the supply potential Vdd, that is, Vdd/2. The Bit-Line pairs are short-circuited by a transistor—controlled by Equalizer Circuits, mostly part of the Precharge Circuit—so that they are each at an equal potential. The precharging and potential equalization by the Precharging Circuit is important due to the disparate difference in capacitance between the Bit-Lines and the storage capacitor. Since the capacitance of the storage capacitor is far less than that of the Bit-Lines, when the storage capacitor is connected to the Bit-Lines via the access transistor, the potential of the Bit-Line changes only slightly, typically by 100 mV. If the storage capacitor was empty, then the potential of the Bit-Line slightly decreases; if charged, then the potential slightly increases. The activated Sense Amplifier amplifies the potential difference on the two Bit-Lines of the pair. In the first case, it draws the potential of the Bit-Line connected to the storage capacitor down to ground and raises the potential of the other Bit-Line up to Vdd. In the second case, the Bit-Line connected to the storage capacitor is raised to Vdd potential and the other Bit-Line is decreased to ground. Without the Precharging Circuit, the Sense Amplifier would need to amplify the absolute potential of the Bit-Lines. However, because of the relatively small potential change between the Bit-Lines, the amplifying process would be much less stable and unreliable. It should be noted that as the access transistors remain on by the activated Word-Line, the accessed data are written back into the Memory Cells of one Row. Therefore, the accessing of a single Memory Cell simultaneously leads to a refreshing of the whole Word-Line. After the Data Output is completed, the Sense Amplifiers and the Row and Column Decoders are disabled and the I/O Gate block is switched off. At that time, the Bit-Lines are still on the potentials according to the accessed data. The refreshed Memory Cells along the same Row are disconnected from the Bit-Lines by the disabled Word-Line. The Precharge Circuit is activated to lower and increase respectively the potentials of the Bit-Lines to Vdd/2 and equalize them again. The Memory Cell Array is then ready for another memory access. In addition, as previously mentioned, the data are stored in the form of electrical charges in the storage capacitor. Ideally, the charges in the storage capacitor should remain indefinitely. However, as a practical matter, the storage capacitor discharges over the course of time via the access transistor and its dielectric layer thereby losing the stored charges and the represented data. Hence the storage capacitor must be refreshed periodically. As discussed above, during the course of a memory access, a refresh of the Memory Cells within the addressed Row is automatically performed. Due to physical constraints, the size of a single Memory Cell Array is limited. Thus, in order to increase overall memory capacity, Memory Cell Arrays can typically be stacked together to provide for the desired capacity. The Precharge Circuit which performs the precharge and equalization functions as mentioned above may also be incorporated into a Sense Amplifier.

The road map for CMOS Integrated Circuit (IC) technology in semiconductor industry generally is to move to lower power supply voltages. There are many reasons for this trend, but the main reason is a demand for higher integration density and lower power consumption. With the emergence of new, higher performance electronics required for modern, often battery operated devices, such as palm-top computers, personal data assistants, mobile phones, navigation systems etc., it is critical to reduce size and power consumption of their ICs, especially for data storage memory ICs. Because industry is also performance driven, ultra fast CMOS devices have very thin gate oxides that determine the maximum voltage these devices can withstand without causing permanent damage to the device. Each new thrust in technology advancement may therefore yield higher chip and component densities with faster clock speeds and lower power consumption and simultaneously result in smaller chip areas. This substantially improves performance and significantly reduces production cost.

As one means to implement a low power feature for semiconductor memory devices the operating power supply voltage is lowered and a low driving voltage is used, both for high speed operation and reduced power consumption. Various technical supplements have been proposed to improve the operation of the Read/Write Circuits and Sense Amplifiers in such memory devices, mostly adopted for the Read operations of DRAMs. One formation of such supplements is an over-driving scheme of the Sense Amplifier, another one is a multi-level voltage operation scheme for certain circuit blocks in the DRAM, both statically and dynamically applied; whereby besides a normal supply voltage, say Vcc or Vdd, an elevated, by an internal charge pump generated voltage Vpp is introduced for critical auxiliary circuit blocks. In general, if data of a plurality of Memory Cells are transferred onto Bit-Lines, wherein the Memory Cells are connected to a certain Word-Line activated by a Row Address, a Bit-Line Sense Amplifier senses and amplifies the voltage difference between two corresponding Bit-Lines constructing a Bit-Line pair. In the above process, since thousands of Bit-Line Sense Amplifiers start to operate simultaneously, the driving time for the Bit-Line Sense Amplifiers is determined according to the amount of current for driving all the Bit-Line Sense Amplifiers. However, since the operating voltage is lowered according to said trend for low power memory devices, it is difficult to supply sufficient current in a given moment. To overcome that kind of obstacle, over-driving is adopted so as to instantly supply a voltage Vdd higher than an internal core voltage Vcc, onto the power line of the Bit-Line Sense Amplifier at an initiative operating period of the Bit-Line Sense Amplifier (during a period immediately after the charge sharing between a Memory Cell and a Bit-Line).

Technical supplements for an enhancement in Write operations however as subject of this invention are described in the following. Implementations of such Write operation supplements with various auxiliary circuit additions and in different variations of technology at the current state of manufacture in industry are already known. These additions and technologies yet are expensive and it is desirable to find solutions that are less expensive.

The explanations and descriptions above have been dispreaded on purpose so extensively in order to clarify and illustrate the functioning of RAM ICs and emphasize the key role of Sense Amplifiers and their embedding into such devices and in order to foster a better comprehension of their importance for the read/write operations in memory products.

Preferred prior art realizations are implementing DRAMs with pertinent auxiliary circuit additions differently, more complex in function and more expensive in production. It is therefore a challenge for the designer of such circuits to achieve a high-quality, but lower-cost solution. There are various patents referring to such solutions.

U.S. Pat. No. 6,181,193 (to Coughlin, Jr.) teaches using thick-oxide CMOS devices to interface high voltage integrated circuits, whereby in a high voltage tolerant CMOS input/output interface circuit a process feature called "dual-gate" or "thick-oxide" process is used on any devices that will be exposed to high voltage. The thick-oxide devices have a larger capacitance and lower bandwidth, and therefore, preferably, they are only used where exposure to high voltage can cause damage. The remaining devices on the interface circuit may all use a standard process with the thinner oxide, allowing the I/O and the core IC to run at maximum speed. The circuit design topology also limits the number of devices that are exposed to high voltage. Preferably, the protection scheme is broken down into two parts: the driver and receiver.

U.S. Pat. No. 6,661,253 (to Lee et al.) discloses passgate structures for use in low-voltage applications wherein enhanced passgate structures for use in low-voltage systems are presented in which the influence of the threshold voltage $V_t$ on the range of signals passed by single-transistor passgates is reduced. In one arrangement, the gate voltage $V_{GATE}$-$V_t$ limit for signals propagated through NMOS passgates is raised by applying a higher $V_{GATE}$; in another arrangement, the $V_t$ is lowered. The use of CMOS passgates in applications where single-transistor passgates have traditionally been used is also presented.

U.S. Pat. No. 6,816,418 (to Hidaka) introduces a MIS semiconductor device having improved gate insulating film reliability. A reliability evaluation value of a gate insulating film of an insulated gate type (MIS) transistor in an unselected state is set to a value equal to or smaller than the reliability evaluation value of the gate insulating film of the MIS transistor in a selected state. An electric field applied to the gate insulating film is determined in accordance with the reliability evaluation value. Therefore, it is possible to the gate insulating film applied electric field of the MIS transistor in the unselected state lower than the electric field in the selected state to assure the reliability of the gate insulating film of the MIS transistor in the unselected state. Thus, the reliability of the gate insulating film of the MIS transistor in the unselected state is assured, and a semiconductor device with an improved gate dielectric characteristic is obtained.

In the prior art, there are different technical approaches for achieving the goal of sped-up Write operations for integrated memory circuit in DRAM configuration. However these approaches use often solutions, which are somewhat technically complex and therefore also expensive in production. It would be advantageous to reduce the expenses in both areas.

Although the above mentioned patents describe circuits and/or methods close to the field of the invention they differ in essential features from the circuit, the system and especially the method introduced here.

SUMMARY OF THE INVENTION

A principal object of the present invention is to realize a circuit for implementing a Bit-Line Sense Amplifier with Data-Line (DL) Bit Switch (BS) pass transistors for Random Access Memory (RAM) products exhibiting a higher writing speed and at the same time keeping a good data stability.

Another principal object of the present invention is to provide an effective and very manufacturable method for implementing a circuit for a Bit-Line Sense Amplifier with Data-Line Bit Switch (BS) pass transistors for Random Access Memory (RAM) products exhibiting a higher writing speed and also reaching a higher integration density.

Another further object of the present invention is to attain a smaller chip size for the memory chip by reducing the layout area of the Bit Switch (BS) FET-switches and thus also the overall die size.

Another still further object of the present invention is to allow a higher maximum voltage value VBS of the Bit Switch (BS) control signal applied to the gate of the Bit Switch (BS) FET-switches.

Further another object of the present invention is to give a method for the dimensioning of the circuit, whereby the voltage value VBS of the Bit Switch (BS) control signal is chosen in such a way, that the operating characteristics of said RAM product with respect to a good write stability and a high write speed are optimized.

A still further object of the present invention is to give a method for the design of the circuit wherein the maximum voltage value VBS of said Bit Switch control signal driving the gate of said Bit Switch (BS) pass transistors is chosen as high as the maximum allowable gate voltage VPP>VCC (P short for Pump, C for Core).

Another further object of the present invention is to reduce the cost of manufacturing by implementing the memory circuit as monolithic integrated circuit in low cost CMOS technology.

Also an object of the present invention is to give a method using thin and thick oxide realizations for crucial transistor devices within the memory chip fabricated in modern integrated circuit CMOS technology.

Another still further object of the present invention is to give a method wherein the gate dimensioning parameters Width-to-Length ratio $(W/L)_{34}=Y_{34}$ of thick-oxide NMOS transistors used as Bit Switch (BS) FET-switches is chosen much smaller than the gate dimensioning parameters $(W/L)_{12}=Y_{12}$ of thin-oxide NMOS BLSA-transistors used therein.

In accordance with the objects of this invention a new circuit is described, capable of realizing a Bit-Line Sense Amplifier for Random Access Memory (RAM) products with Data-Line Bit Switch pass transistors for Random Access Memory (RAM) products, comprising a Bit-Line Sense Amplifier (BLSA) made-up of one pair of PMOS transistors and one pair of NMOS transistors, all of them implemented as thin-oxide transistors, i.e. forming two thin-oxide PMOS transistors and two thin-oxide NMOS transistors respectively which thus exhibit maximum allowable gate voltages of VCC, e.g. the core voltage of the device; further comprising a pair of Bit Switch (BS) pass transistors implemented as thick-oxide NMOS transistors operating as FET-switches and gate controlled by a BS control signal thus forming two thick-oxide NMOS-transistors now named as BS FET-switches, and thus exhibiting maximum allowable gate voltages of VPP, a charge pump voltage of the device e.g. which is greater as VCC, i.e. VPP>VCC; and finally comprising a pair of Data-Line (DL) conductors connected to one side of said pair of Bit Switch (BS) pass transistors, which on their other side are connected to certain connection points of said Bit-Line Sense Amplifier (BLSA), which on its part consists of said two thin-oxide PMOS transistors and said two thin-oxide NMOS transistors both now designated as BLSA-transistors for distinction, whereby the drains of said PMOS BLSA-transistors are connected to the drains of said NMOS BLSA-transistors, respectively, thus defining said particular connection points, wherefrom the DL-signals to said BS FET-switches formed as thick-oxide NMOS transistors are departing; these BLSA-transistors forming a configuration for said PMOS BLSA-transistors which each have their sources connected in common to a voltage signal supplying and enabling said Bit-Line Sense Amplifier and where the two PMOS BLSA-transistors include gates which are cross-coupled with the drains of the respective opposite PMOS BLSA-transistor; moreover in said configuration the sources of said NMOS BLSA-transistors are coupled to each other and are connected in common to a ground pin whereby too the gates of said NMOS BLSA-transistors are cross-coupled with the drains of the respective opposite NMOS BLSA-transistors; finally do said PMOS BLSA-transistors have their bulks connected to their sources, where a BLSA enabling signal is received, which at the same time supplies the power for said Bit-Line Sense Amplifier (BLSA).

Further in accordance with the objects of this invention a new circuit is described, capable of realizing a Bit-Line Sense Amplifier with Data-Line Bit Switch pass transistors for Random Access Memory (RAM) products, comprising a means for realizing the function of a Bit-Line Sense Amplifier (BLSA); also comprising a pair of Bit Switch (BS) pass transistors implemented as thick-oxide NMOS transistors operating as FET-switches and gate controlled by a BS control signal thus forming two thick-oxide NMOS-transistors now named as BS FET-switches; and finally comprising a pair of Data-Line (DL) conductors connected to one side of said pair of Bit Switch (BS) pass transistors, which on their other side are connected to certain connection points of said means for realizing the function of a Bit-Line Sense Amplifier (BLSA), which on its part consists of an amplifying means built with MOS transistors of the PMOS and NMOS type, here altogether designated as BLSA-transistors.

Also in accordance with the objects of this invention a new method is described, capable of implementing a Random Access Memory (RAM) product with Data-Line Bit Switch pass transistors implemented as thick-oxide MOS transistor components and realized as an Integrated Circuit (IC) fabricated in CMOS technology, comprising: providing a means for realizing the function of a Bit-Line Sense Amplifier (BLSA) which consists of an amplifying means built with MOS transistors of the PMOS and/or NMOS type, here all together designated as BLSA-transistors; providing a pair of Bit Switch (BS) pass transistors implemented as thick-oxide MOS transistors operating as FET-switches and gate controlled by a BS control signal with maximum voltage VBS thus forming two thick-oxide MOS-transistors named as BS FET-switches; providing a pair of Data-Line (DL) conductors connected to one side of said pair of Bit Switch (BS) pass transistors named as BS FET-switches, which on their other side are connected to certain connection points of said means for realizing the function of a Bit-Line Sense Amplifier (BLSA) and serving as input/output terminal pins therefore feeding a first line with normal potential and a second line with complementary potential together forming a pair of complementary Data-Lines switched by said pair of MOS transistors named as BS FET-switches; connecting said input/output terminal pins of said means for realizing the function of a Bit-Line Sense Amplifier (BLSA) to the drains/sources of said pair of Bit Switch (BS) MOS transistors named as BS FET-switches; connecting the sources/drains of said pair of Bit Switch (BS) MOS transistors named as BS FET-switches to said pair of complementary Data-Lines; realizing said RAM product as an IC fabricated in CMOS technology introducing two thicknesses for oxide layers added to a standard CMOS process in order to produce said thin and thick-oxide MOS transistors; implementing said MOS BLSA-transistors within said means for realizing the function of a Bit-Line Sense Amplifier (BLSA) as thin-oxide MOS transistors with maximum gate voltage VCC, the core voltage of the device e.g.; dimensioning the gates of said MOS BLSA-transistors made as thin-oxide MOS transistors within said Bit-Line Sense Amplifier by its Width-to-Length ratio $(W/L)_{12}=Y_{12}$; implementing said pair of Bit Switch (BS) MOS transistors as thick-oxide MOS transistors with maximum gate voltage VPP, a charge pump voltage of the device e.g. which is greater as VCC, i.e. VPP>VCC; dimensioning the gates of said MOS transistors made as thick-oxide MOS transistors for said Bit Switch transistors by its Width-to-Length ratio $(W/L)_{34}=Y_{34}$; choosing the gate dimension $(W/L)_{34}=Y_{34}$ of said thick-oxide MOS transistors much smaller than the gate dimension $(W/L)_{12}=Y_{12}$ of said thin-oxide MOS transistors; choosing said maximum voltage value VBS of said Bit Switch control signal driving the gate of said Bit Switch transistors as high as said maximum gate voltage VPP; and optimizing said maximum voltage value VBS of said Bit Switch control signal within said RAM IC for both, a good write stability and a high write speed.

Finally in accordance with the objects of this invention a new method is described, capable of implementing a Bit-Line Sense Amplifier with Data-Line Bit Switch pass transistors for Random Access Memory (RAM) products realized as Integrated Circuit (IC) fabricated in CMOS technology, comprising: providing for said RAM products a Bit-Line Sense Amplifier (BLSA) made up of multiple PMOS and NMOS transistors and operating on two complementary data signals at two input/output terminal pins and also having a supply voltage terminal pin as well as a ground terminal pin; providing for each of said input/output terminal pins an NMOS switch transistor operating as Bit Switch and thus gate driven by a Bit Switch control signal with maximum voltage VBS, together forming a pair of Bit Switch NMOS transistors; providing for said RAM IC two Data-Line (DL) conductors each switchable connected to one of said input/output terminal pins via said Bit Switch NMOS switch transistor, a first line with normal potential and a second line with complementary potential together forming a pair of complementary Data-Lines switched by a pair of NMOS switch transistors; arranging said PMOS and said NMOS transistors within said Bit-Line Sense Amplifier as pairs in each case connected in cross-coupled configuration and both pairs connected in series and stacked one upon the other; conjoining said PMOS transistor pair within said Bit-Line Sense Amplifier—with its sources—and at the same time to said supply voltage terminal pin; conjoining said NMOS transistor pair within said Bit-Line Sense Amplifier—with its sources—and at the same time to said ground terminal pin; connecting the drains of said PMOS transistors within said Bit-Line Sense Amplifier to the drains of said NMOS transistors, respectively, thus defining particular connection points for use as said input/output terminal pins; connecting said input/output terminal pins of said Bit-Line Sense Amplifier to the drains/sources of said pair of Bit Switch NMOS transistors; connecting the sources/drains of said pair of Bit Switch NMOS transistors to said pair of complementary Data-Lines; realizing said RAM product as an IC fabricated in CMOS technology introducing two thicknesses for oxide layers added to a standard CMOS process in order to produce separate thin and thick-oxide MOS transistors; implementing said PMOS and said NMOS transistors within said Bit-Line Sense Amplifier as thin-oxide MOS transistors with maximum gate voltage VCC, the core voltage of the device e.g.; dimensioning the gate of said NMOS transistors made as thin-oxide MOS transistors within said Bit-Line Sense Amplifier by its Width-to-Length ratio $(W/L)_{12} = Y_{12}$; implementing said pair of Bit Switch NMOS transistors as thick-oxide MOS transistors with maximum gate voltage VPP, a charge pump voltage of the device e.g. which is greater as VCC, i.e. VPP>VCC; dimensioning the gate of said NMOS transistors made as thick-oxide MOS transistors for said Bit Switch transistors by its Width-to-Length ratio $(W/L)_{34} = Y_{34}$; choosing the gate dimension $(W/L)_{34} = Y_{34}$ of said thick-oxide MOS transistors much smaller than the gate dimension $(W/L)_{12} = Y_{12}$ of said thin-oxide MOS transistors; choosing said maximum voltage value VBS of said Bit Switch control signal driving the gate of said Bit Switch transistors as high as said maximum gate voltage VPP; and optimizing said maximum voltage value VBS of said Bit Switch control signal within said RAM IC for both, a good write stability and a high write speed.

BRIEF DESCRIPTION OF THE DRAWINGS

In the accompanying drawings forming a material part of this description, the details of the invention are shown.

DESCRIPTION OF THE PREFERRED EMBODIMENTS

The preferred embodiment discloses a novel realization for a "Bit-Line Sense Amplifier with Bit Switch" circuit for semiconductor memory ICs. The technical approach for achieving the goal of sped-up Write operations for integrated memory circuit in DRAM configuration uses a two thickness technique of oxide layers for realizing crucial internal auxiliary circuit parts of the chip. Using the intrinsic advantages of that solution—as described later on in every detail—the method for using the circuit of the invention as realized with standard CMOS technology at low cost is described.

Figure 1:
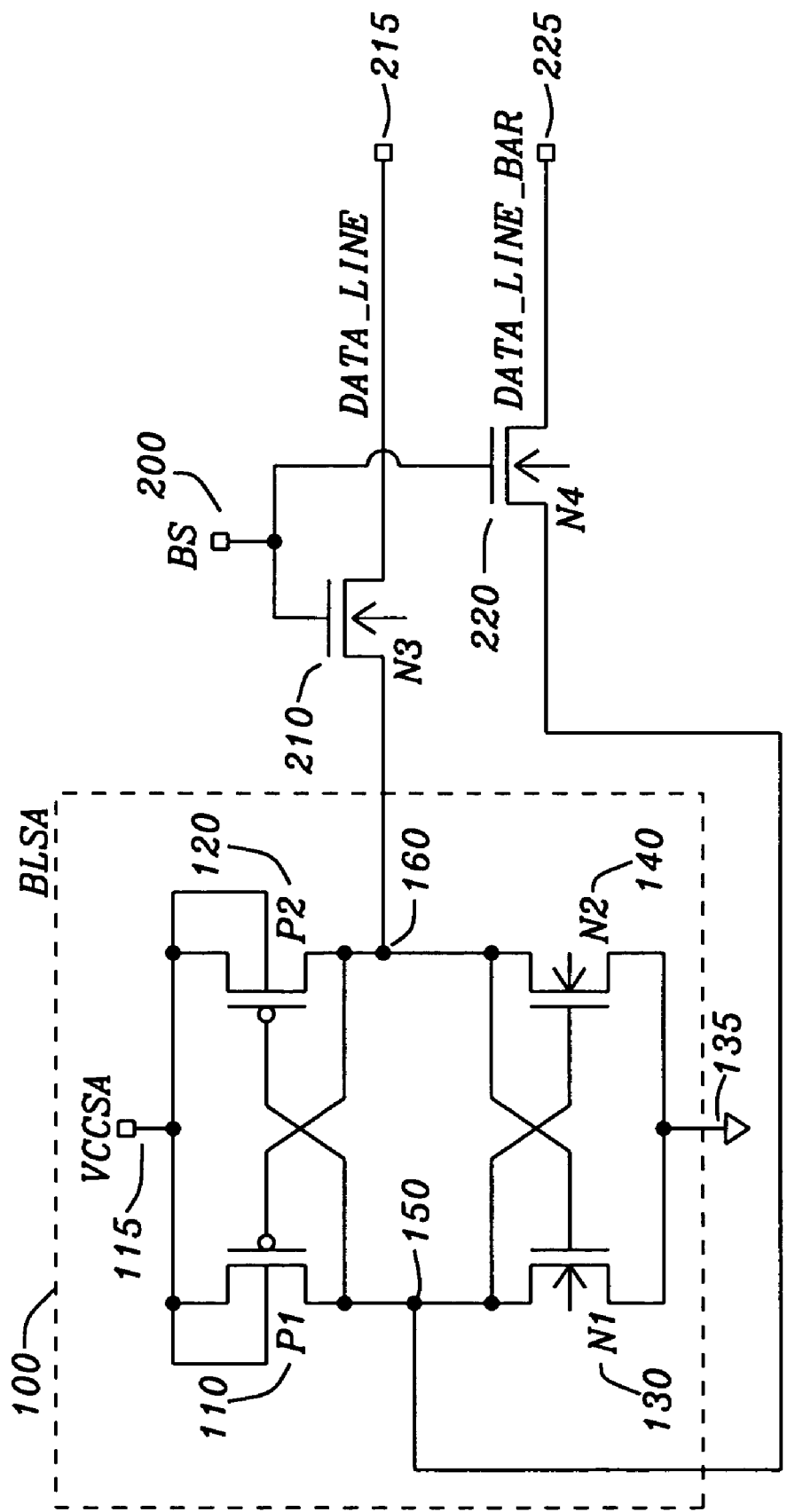
FIG. 1 shows the relevant auxiliary or peripheral circuit components for a Random Access Memory (RAM) IC named "Bit-Line Sense Amplifier with Bit Switch" in form of a circuit diagram for this invention.

Contemplating now FIG. 1, a circuit diagram of the new realization for the "Bit-Line Sense Amplifier with Bit Switch" circuit of this invention for memory devices is depicted. As can be seen from the schematics a Bit-Line Sense Amplifier block (item 100) abbreviated as BLSA delivers two complementary signals named DATA_LINE (215) and DATA_LINE_BAR (225) respectively controlled by two Bit-Line Switch or I/O-Gate transistors (N3 and N4; items 210 & 220) via their corresponding lines. Said Bit-Line Sense Amplifier block BLSA (item 100) is when activated, supplied by a supply voltage VCCSA (VCC for Sense Amplifier SA), which in the CMOS technology of the invention adopts a value of 2V; (letter C thereby referring to the Core of the circuit). This voltage represents also the maximum gate voltage for all the internal (i.e. within BLSA, thus within block 100) MOS transistors (P1, P2, N1, and N2; items 110, 120, 130, & 140) fabricated in CMOS technology as thin-oxide devices. The two FET transistor switches (N3 and N4; items 210 & 220) however are now manufactured as thick-oxide devices in CMOS technology according to the invention—in contrast to the known prior art solutions with thin-oxide realization, i.e. components of the same oxide thickness as for all the other transistors, by the way. Thick-oxide devices in CMOS technology according to this invention support a maximum gate voltage of VPP (P for Pump), adopting here an elevated value of 3V, mostly generated by integrated charge pump circuits. Thereby a first NMOS transistor N3 (item 210) feeds DATA_LINE (215) and a second NMOS transistor N4 (item 220) feeds DATA_LINE_BAR (225), and where both Bit-Line Switch or I/O-Gate transistors are commonly driven by a Bit Switch signal (200) abbreviated as BS, thus controlling said DATA_LINE (215) and DATA_LINE_BAR (225) signals often also named as Bit-Line and Bit-Line_bar or as I/O and I/O_bar correspondingly, alternately these conductors are named simply as Data-Lines (DL), as preferably used herein. The maximum voltage level of said Bit Switch signal BS is VBS, the minimum level of the Bit Switch signal BS takes on ground potential or 0V. According to the invention the VBS voltage range is now extending from 0V up to VPP (3V), whereas in prior art circuits it could only reach a VCC (2V) level maximum, thus a wider range of selection for VBS values is achieved. This leads to important consequences in terms of writing speed and chip size. Both parameters are advantageously influenced by this invention.

Said Bit-Line Sense Amplifier block BLSA (item 100) is, in the case depicted in FIG. 1, made up of a pair of PMOS transistors, named P1 (110) and P2 (120), and a pair of NMOS transistors, named N1 (130) and N2 (140), in each case connected in cross-coupled configuration and both pairs connected in series and stacked one upon the other, i.e. P1 (110) upon N1 (130) at connection point (150) and P2 (120) upon N2 (140) at connection point (160), additionally said PMOS transistor pair P1 and P2 (110 & 120) is—with its sources—connected to pin VCCSA (115) and said NMOS transistor pair N1 and N2 (130 & 140) is—with its sources again—connected to ground pin (135). In other words, Bit-Line Sense Amplifier BLSA (100), which is of the voltage sense type, includes said PMOS transistors P1 and P2 (110 & 120) which each have sources connected in common to the voltage signal VCCSA—which is the supply voltage Vcc for SA (Sense Amplifier)—enabling said Bit-Line Sense Amplifier (100). VCCSA (115) thus serves as an activating signal for said Bit-Line Sense Amplifier (100), normally responsive to a signal e.g. from a Column Selection circuit (not shown). The drains of PMOS transistors (110 & 120) are connected to the drains of NMOS transistors (130 & 140), respectively, thus defining said particular connection points (150 & 160), wherefrom said signals to said FET transistor switches (N3 and N4; items 210 & 220) are departing. The two PMOS transistors P1 and P2 (110 & 120) include gates which are cross-coupled with the drains of the respective opposite PMOS transistor. Sources of NMOS transistors N1 and N2 (130 & 140) are coupled to each other and are also connected in common to said ground pin (135). The gates of NMOS transistors N1 and N2 (130 & 140) are cross-coupled again with the drains of the respective opposite NMOS transistor.

Furthermore do said PMOS transistors P1 and P2 (110 & 120) have their bulks connected to their sources. All the bulks of the NMOS transistors N1 . . . N4 in the circuit however are tied to VSS (135) or ground (GND).

This type of Bit-Line Sense Amplifier is known in literature as a latching Sense Amplifier, because of its ability to store data. It is furthermore of the voltage sense sub-type, whereas also other sub-types exist, as there are also current sense type amplifiers or even differential sense amplifiers; however a simple differential sense amplifier would need an extra bias current and hence a large layout area not very suitable for latch-type sense amplifiers.

The actual invention shall now be technologically described and explained. The structure of the fabrication process for semiconductor realizations in CMOS technology is expanded by using two different thicknesses of oxide for pertinent FET devices, thus resulting in two levels of maximum gate voltages for the pertinent FET devices. Thin-oxide FET devices support a maximum gate voltage of VCC adopting 2V in the CMOS technology taken as example here. Thick-oxide FET devices support a maximum gate voltage of VPP adopting 3V in this same CMOS technology. MOS transistors generally have their gates dimensioned by Width W and Length L defining hence a characteristic Width-to-Length ratio W/L=Y, proportional to the resistive conductance Y of the MOS transistor. As a reminder: Gate Length is the distance that the electrons/holes travel between source and drain, while gate Width provides the dimension that controls how much current can come from the transistor. The maximum current allowed between the source and drain is called the saturation drive current (Idsat), and in general it is normalized by gate width W. Typical values for NMOS are ~1 mA/μm, and for PMOS are ~0.5 to 0.7 mA/μm. The two NMOS transistors N1 and N2 (130 & 140) of the BLSA display the same W/L ratio $Y_{12}$. The two NMOS transistors N3 and N4 (210 & 220), namely the BS transistors, display again the same W/L ratio $Y_{34}$, however different to $Y_{12}$. In prior art circuits with only thin-oxide devices the ratio $Y_{12}$ is normally dimensioned two times the ratio $Y_{34}$; this choice is made in order to get a good stability during write operations by switching BS transistors with VBS equaling VCC. According to this invention, now with thick-oxide devices for the BS transistors N3 and N4 (210 & 220) and since the maximum of VBS is now higher, VPP instead of VCC in prior art, the ratio $Y_{34}$ can be chosen smaller, still furnishing the same current IBS into the BS transistors N3 and N4 (210 & 220). In the novel circuits according to the invention with thin and thick-oxide devices the ratio $Y_{12}$ is able to be dimensioned greater as two times the ratio $Y_{34}$. Keeping the proportions unchanged for all thin-oxide transistors, i.e. ratio $Y_{12}$ constant, in consequence the ratio $Y_{34}$ has to be made smaller. This leads to a smaller layout area for those two BS transistors N3 and N4 (210 & 220), as for keeping the gate Length constant, because of unchanged drain-source voltage constraints, thus the Width W has to be diminished in order to reduce the ratio $Y_{34}$. The die-size of the RAM according to the invention is therefore smaller compared to devices in prior art.

Contemplating the influence of a wider range of selection for VBS voltage values according to this invention, it is easily recognized that a choice of possible higher VBS values compared to prior art improves the writing speed. Which reveals the other important advantage of the invention: raising the maximum voltage of said BS signal makes switching of the pertinent BS transistors N3 and N4 (210 & 220) faster, ergo resulting in better writing speed parameters for the RAM.

Detailed Description of Principles of Operation and Analysis of Characteristics for NMOS Bit-Switch (Pass) Transistors:

Both NMOS Bit-Switch (BS) transistors N3 (210) and N4 (220) are implemented as thick-oxide MOS transistors of the N-type supporting a maximum gate voltage VPP. They are driven by a common BS voltage VBS adopting values up to VPP>VCC, which is the supply voltage and thus also the maximum gate voltage for all thin-oxide transistors of other parts of the circuit. As already mentioned elsewhere these BS-transistors are controlling complementary Data_Line signals of voltages between VSS (also GND or 0 V) and VCC, conducting currents IBS flowing in either directions depending on data (signal) values 0 or 1 to be written, corresponding to voltage levels VSS (GND) or VCC; where the current IBS may be understood as the Bit Switch Write current. These types of transistor elements are therefore often designated also as pass transistors.

In case of writing 0's, the current IBS is flowing directed outwards, i.e. to the terminal pin 215 with voltage potential 0 or GND; the MOS transistor being of the N-type hence its current IBS flowing from drain to source for NMOS transistor N3 therefore pin 215 is connecting to the source of transistor N3; in the complementary BS-transistor, namely NMOS transistor N4, IBS is again flowing from drain to source, but current IBS is now flowing directed inwards, thus terminal pin 225 is now connected to the drain of transistor N4. In case of writing 1's all operations and current voltage relations at NMOS transistors N3 and N4 are inverted.

Therefore both MOS transistors of the N-type N3 and N4 are strictly bi-directionally operating components, therefore being implemented in a substantially symmetrical way, i.e. with same arrangement, position and size of source and drain electrodes.

An analysis of the operation of Bit Switch (pass) transistors N3 or N4 has to take into account the following physical parameters:

VBS=Voltage of Bit Switch signal applied to gate of Bit Switch (pass) transistor IBS=Write Current through Bit Switch (pass) transistor VGS=Gate Source Voltage of Bit Switch (pass) transistor Vgate=Gate voltage of transistors (always tied to 200 having voltage VBS)

Vsource=Source voltage of transistors
  (writing 0: tied to 215—writing 1: tied to 225)

Vdrain=Drain voltage of transistors
  (writing 0: tied to 225—writing 1: tied to 215)

Idsat=Saturation Drive Current (maximum current between source and drain) of Bit Switch (pass) transistor Vth=Threshold Voltage of Bit Switch (pass) transistor (value of voltage that turns on the transistor, applied to transistor gate electrode)

φv=Voltage Potential of Data_Line

In case of NMOS transistor N3 there is now as explained above (case: writing 0):

$$VGS = Vgate - Vsource = VBS - \phi v$$

as the writing speed is proportional to the Write Current IBS, and the latter can be approximately represented by the Saturation Drive Current Idsat flowing through the pass transistor, for which in NMOS cases the following relation holds:

$$\text{Write Speed} \sim IBS \approx Idsat = K'(VGS - Vth)^2 = K'(VBS - \phi v - Vth)^2 = K'(VBS - Vth)^2$$

using the above equation for VGS and letting φv=0 (because of writing 0 to the Data_Line) it can be clearly seen, how substantially the writing speed is improving when VBS is raised from VCC in case of thin-oxide transistors to VPP in case of thick-oxide transistors with VPP>VCC.

The Ruling Square-Law Thus Leads to a Significant Enhancement in Writing Speed as Described in This Invention.

Although in the preferred embodiment of the present invention as described above, the transistors connected to pin VCCSA (115) are constructed as PMOS transistors and the transistors connected to ground pin (135) are realized as NMOS transistors, it is well known to someone skilled in the art that it is possible to apply other transistors having a different polarity, and to apply a different polarity power supply, all this in accordance with the present invention. Analogical considerations apply for the NMOS transistors or I/O-Gate transistors used for Bit-Line Switch purposes and its corresponding control signal and also its switched Data-Line signals (215 & 225), respectively. It shall furthermore be mentioned explicitly, that the whole interior configuration for the Bit-Line Sense Amplifier block (item 100) abbreviated as BLSA may also be replaced by an equivalent but configurational differing circuit.

Figure 2A:
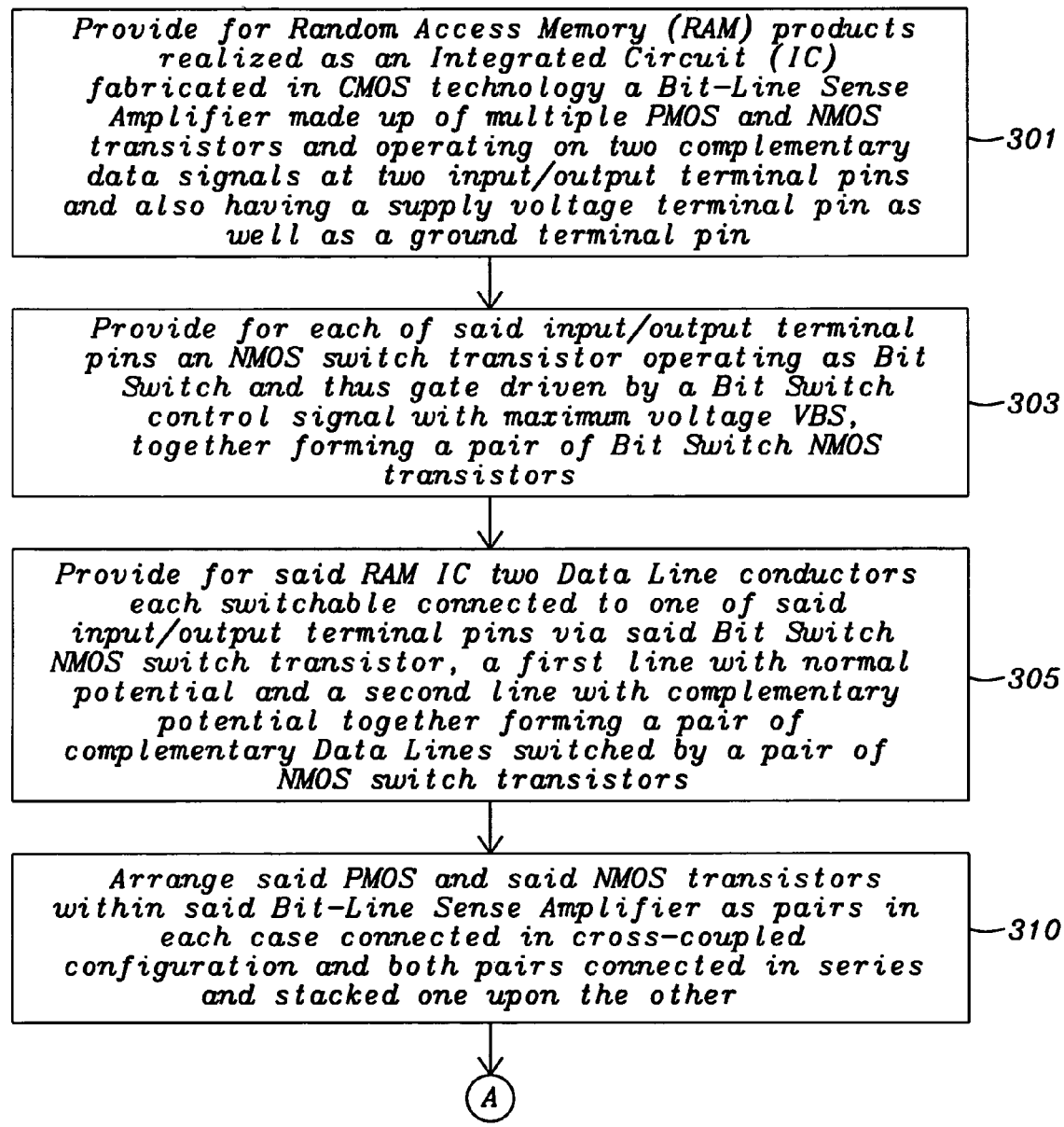
FIGS. 2A-2C describe with the help of a flow diagram the according method for constructing and operating a circuit for the RAM devices of the invention as shown in FIG. 1.
Figure 2B:
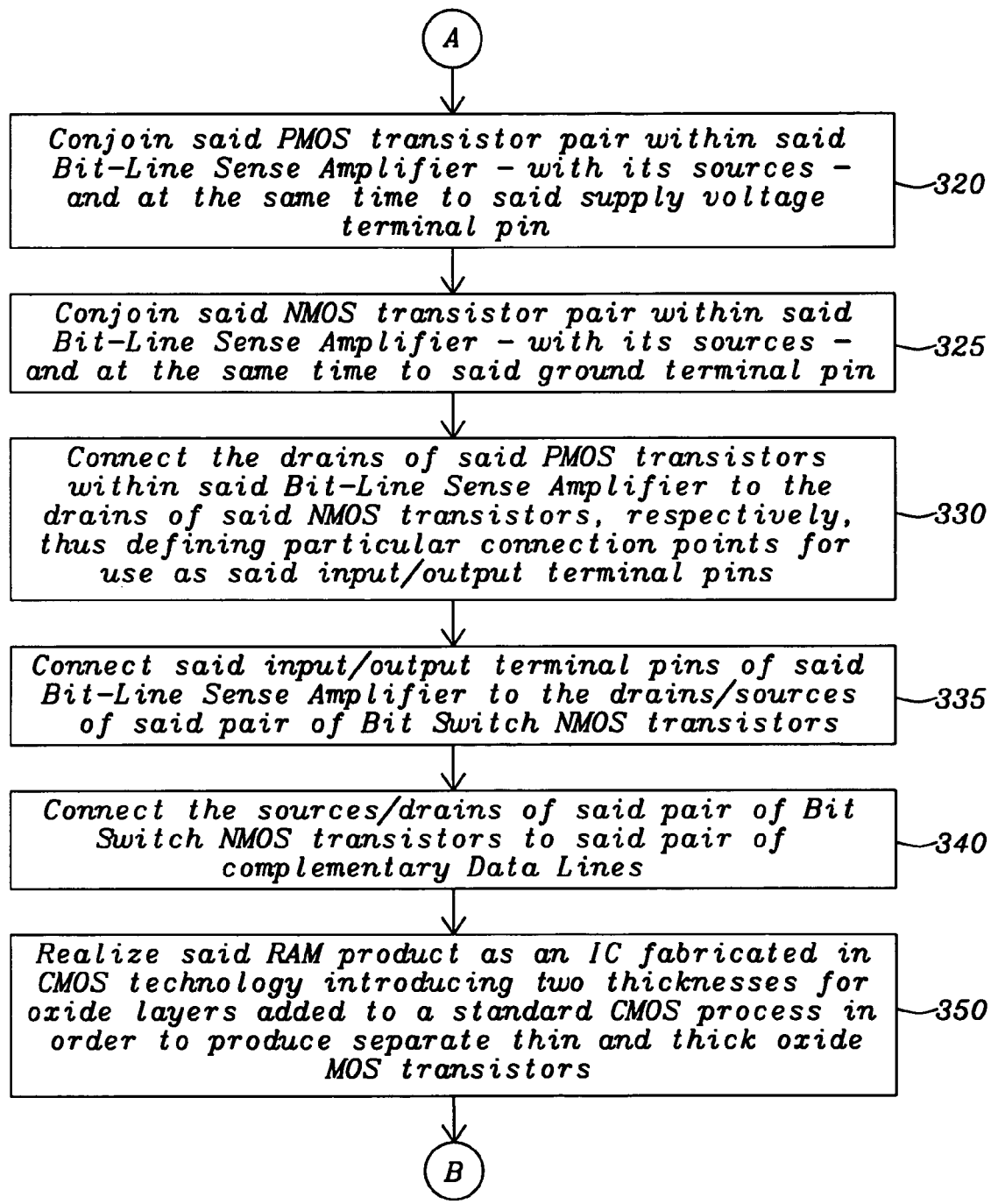
Figure 2C:
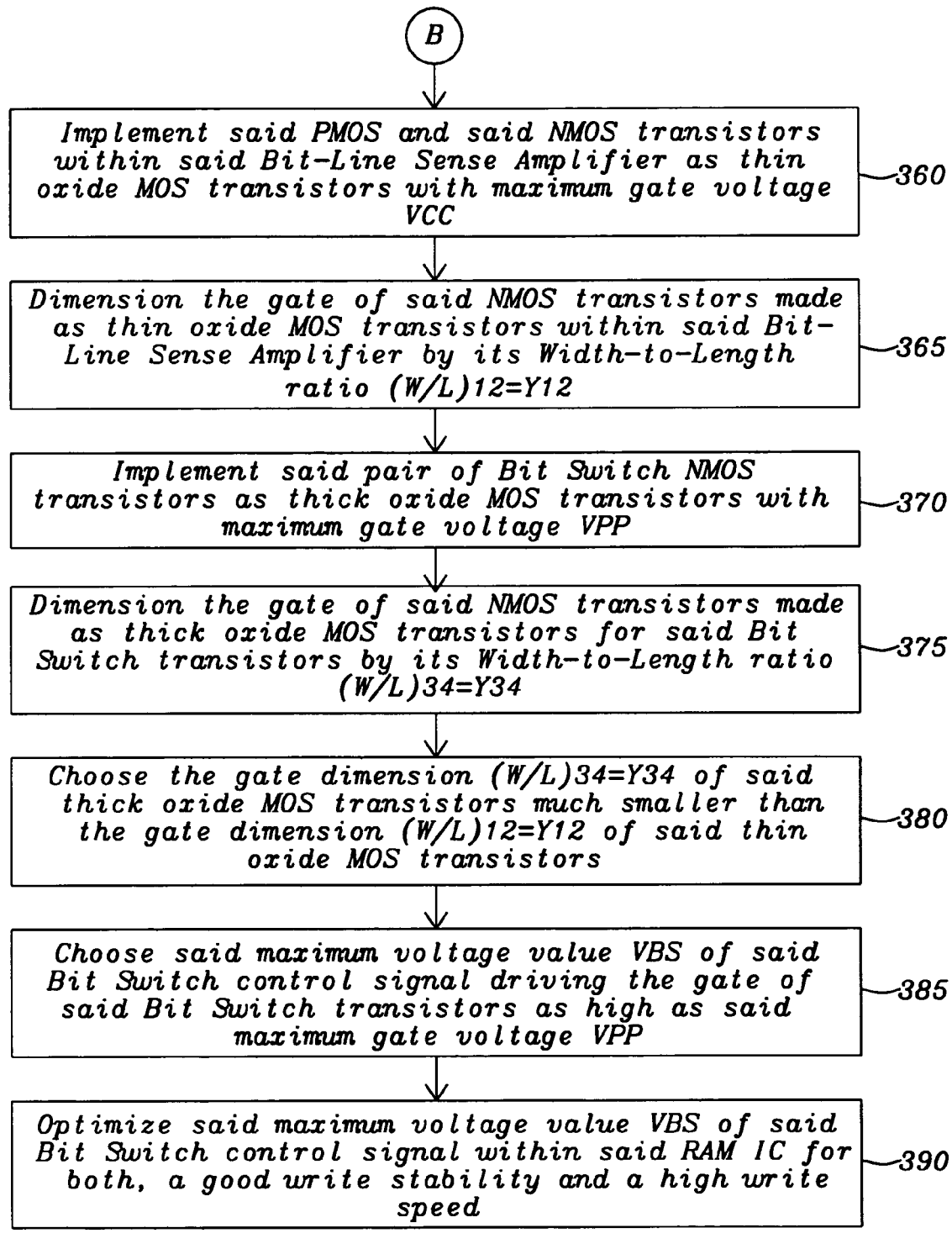

Regarding the flow diagram given in FIGS. 2A-2C, a method, explaining the operation of the novel realization of an integrated circuit for memory devices according to the invention and exemplified in FIG. 1 is now described and defined by its steps, wherein a first step 301 provides a Bit-Line Sense Amplifier for Random Access Memory (RAM) products, realized as an Integrated Circuit (IC) and fabricated in CMOS technology, this amplifier itself made up of multiple PMOS and NMOS transistors and operating on two complementary data signals at two input/output terminal pins and also having a supply voltage terminal pin as well as a ground terminal pin. Step 303 provides for each of said input/output terminal pins an NMOS switch transistor operating as Bit Switch and thus gate driven by a Bit Switch control signal with maximum voltage VBS, together forming a pair of Bit Switch NMOS transistors and the following step 305 provides for said RAM IC two Data-Line conductors each switchable connected to one of said input/output terminal pins via said Bit Switch NMOS switch transistor, a first line with normal potential and a second line with complementary potential together forming a pair of complementary Data-Lines switched by a pair of NMOS switch transistors. At step 310 said PMOS and said NMOS transistors within said Bit-Line Sense Amplifier are arranged as pairs, in each case connected in cross-coupled configuration and both pairs connected in series and stacked one upon the other. Steps 320 and 325 in each case conjoin said PMOS transistor pair within said Bit-Line Sense Amplifier—with its sources—and at the same time to said supply voltage terminal pin and also conjoin said NMOS transistor pair within said Bit-Line Sense Amplifier—with its sources—and at the same time to said ground terminal pin. The three following steps 330, 335 and 340 at first connect the drains of said PMOS transistors within said Bit-Line Sense Amplifier to the drains of said NMOS transistors, respectively, thus defining particular connection points for use as said input/output terminal pins and then connect said input/output terminal pins of said Bit-Line Sense Amplifier to the drains/sources of said pair of Bit Switch NMOS transistors and finally connect the sources/drains of said pair of Bit Switch NMOS transistors to said pair of complementary Data-Lines. Now starting with step 350 realizing said RAM product as an IC fabricated in CMOS technology begins, introducing two thicknesses for oxide layers added to a standard CMOS process in order to produce separate thin and thick-oxide MOS transistors. Steps 360 and 365 implement said PMOS and said NMOS transistors within said Bit-Line Sense Amplifier as thin-oxide MOS transistors with maximum gate voltage VCC and dimension the gate of said NMOS transistors made as thin-oxide MOS transistors within said Bit-Line Sense Amplifier by its Width-to-Length ratio $(W/L)_{12}=Y_{12}$, whereas steps 370 and 375 implement said pair of Bit Switch NMOS transistors as thick-oxide MOS transistors with maximum gate voltage VPP and dimension the gate of said NMOS transistors made as thick-oxide MOS transistors for said Bit Switch transistors by its Width-to-Length ratio $(W/L)_{34}=Y_{34}$. Within step 380 the gate dimension $(W/L)_{34}=Y_{34}$ of said thick-oxide MOS transistors is chosen, much smaller than the gate dimension $(W/L)_{12}=Y_{12}$ of said thin-oxide MOS transistors. Step 385 then chooses said maximum voltage value VBS of said Bit Switch control signal driving the gate of said Bit Switch transistors as high as said maximum gate voltage VPP. Finally in step 390, optimizing said maximum voltage value VBS of said Bit Switch control signal within said RAM IC is done for both, good write stability and higher write speed.

The technology used hereby is very cost effective, because the introduction of two thicknesses for oxide layers added to a standard CMOS process comprises only a few production steps to make separate thin and thick-oxide MOS transistors.

Summarizing the essential features of the realization of the circuit we find, that in the integrated CMOS circuit of the present invention a novel method is implemented, whereby the writing speed is ameliorated and at the same time the chip area is diminished.

As shown in the preferred embodiments and evaluated by circuit analysis, the novel system, circuits and methods provide an effective and manufacturable alternative to the prior art.

While the invention has been particularly illustrated and described with reference to preferred embodiments thereof, it will be understood by those skilled in the art that various changes in form and details may be made without departing from the spirit and scope of the invention. Having shown and explained the principles of this invention with the aid of a given method it should also be readily apparent to those skilled in the art that the invention can be modified in arrangement and structure without departing from such principles. We therefore claim all modifications coming within the spirit and scope of the accompanying claims.

What is claimed is:

1. A method for implementing a Random Access Memory (RAM) product with Data-Line Bit Switch pass transistors implemented as thick-oxide MOS transistor components and realized as an Integrated Circuit (IC) fabricated in MOS technology, comprising:

providing a means for realizing the function of a Bit-Line Sense Amplifier (BLSA) which consists of an amplifying means built with MOS transistors of the PMOS and/or NMOS type, here all together designated as BLSA-transistors;

providing a pair of Bit Switch (BS) pass transistors implemented as thick-oxide MOS transistors operating as FET-switches and gate controlled by a BS control signal with maximum voltage VBS thus forming two thick-oxide MOS-transistors named as BS FET-switches;

providing a pair of Data-Line (DL) conductors connected to one side of said pair of Bit Switch (BS) pass transistors named as BS FET-switches, which on their other side are connected to certain connection points of said means for realizing the function of a Bit-Line Sense Amplifier (BLSA) and serving as input/output terminal pins therefore feeding a first line with normal potential and a second line with complementary potential together forming a pair of complementary Data-Lines switched by said pair of MOS transistors named as BS FET-switches;

connecting said input/output terminal pins of said means for realizing the function of a Bit-Line Sense Amplifier (BLSA) to the drains/sources of said pair of Bit Switch (BS) MOS transistors named as BS FET-switches;

connecting the sources/drains of said pair of Bit Switch (BS) MOS transistors named as BS FET-switches to said pair of complementary Data-Lines;

realizing said RAM product as an IC fabricated in CMOS technology introducing two thicknesses for oxide layers added to a standard CMOS process in order to produce said thin and thick-oxide MOS transistors;

implementing said MOS BLSA-transistors within said means for realizing the function of a Bit-Line Sense Amplifier (BLSA) as thin-oxide MOS transistors with a maximum gate voltage VCC, the core voltage of the device;

dimensioning the gates of said MOS BLSA-transistors made as thin-oxide MOS transistors within said Bit-Line Sense Amplifier by its Width-to-Length ratio $(W/L)_{12}=Y_{12}$;

implementing said pair of Bit Switch (BS) MOS transistors as thick-oxide MOS transistors with a maximum gate voltage VPP, a charge pump voltage of the device which is greater as VCC;

dimensioning the gates of said MOS transistors made as thick-oxide MOS transistors for said Bit Switch transistors by its Width-to-Length ratio $(W/L)_{34}=Y_{34}$;

choosing the gate dimension $(W/L)_{34}=Y_{34}$ of said thick-oxide MOS transistors much smaller than the gate dimension $(W/L)_{12}=Y_{12}$ of said thin-oxide MOS transistors;

choosing said maximum voltage value VBS of said Bit Switch control signal driving the gate of said Bit Switch transistors as high as said maximum gate voltage VPP; and optimizing said maximum voltage value VBS of said Bit Switch control signal within said RAM IC for both, a good write stability and a high write speed.

2. The method according to claim 1 wherein said means for realizing the function of a Bit-Line Sense Amplifier (BLSA) is realized as a differential Sense Amplifier.

3. The method according to claim 1 wherein said means for realizing the function of a Bit-Line Sense Amplifier (BLSA) is realized as a latching Sense Amplifier.

4. The method according to claim 1 wherein said means for realizing the function of a Bit-Line Sense Amplifier (BLSA) is realized as a Sense Amplifier of the current-sense type.

5. The method according to claim 1 wherein said means for realizing the function of a Bit-Line Sense Amplifier (BLSA) is realized as a Sense Amplifier of the voltage-sense type.

6. A method for implementing a Bit-Line Sense Amplifier with Data-Line Bit Switch pass transistors for Random Access Memory (RAM) products realized as Integrated Circuit (IC) fabricated in CMOS technology, comprising:

providing for said RAM products a Bit-Line Sense Amplifier (BLSA) made up of multiple PMOS and NMOS transistors and operating on two complementary data signals at two input/output terminal pins and also having a supply voltage terminal pin as well as a ground terminal pin;

providing for each of said input/output terminal pins an NMOS switch transistor operating as Bit Switch and thus gate driven by a Bit Switch control signal with maximum voltage VBS, together forming a pair of Bit Switch NMOS transistors;

providing for said RAM IC two Data-Line (DL) conductors each switchable connected to one of said input/output terminal pins via said Bit Switch NMOS switch transistor, a first line with normal potential and a second line with complementary potential together forming a pair of complementary Data-Lines switched by a pair of NMOS switch transistors;

arranging said PMOS and said NMOS transistors within said Bit-Line Sense Amplifier as pairs in each case connected in cross-coupled configuration and both pairs connected in series and stacked one upon the other;

conjoining said PMOS transistor pair within said Bit-Line Sense Amplifier—with its sources—and at the same time to said supply voltage terminal pin;

conjoining said NMOS transistor pair within said Bit-Line Sense Amplifier—with its sources—and at the same time to said ground terminal pin;

connecting the drains of said PMOS transistors within said Bit-Line Sense Amplifier to the drains of said NMOS transistors, respectively, thus defining particular connection points for use as said input/output terminal pins;

connecting said input/output terminal pins of said Bit-Line Sense Amplifier to the drains/sources of said pair of Bit Switch NMOS transistors;

connecting the sources/drains of said pair of Bit Switch NMOS transistors to said pair of complementary Data-Lines;

realizing said RAM product as an IC fabricated in CMOS technology introducing two thicknesses for oxide layers added to a standard CMOS process in order to produce separate thin and thick-oxide MOS transistors;

implementing said PMOS and said NMOS transistors within said Bit-Line Sense Amplifier as thin-oxide MOS transistors with maximum gate voltage VCC, the core voltage of the device;

dimensioning the gate of said NMOS transistors made as thin-oxide MOS transistors within said Bit-Line Sense Amplifier by its Width-to-Length ratio $(W/L)_{12}=Y_{12}$;

implementing said pair of Bit Switch NMOS transistors as thick-oxide MOS transistors with maximum gate voltage VPP, a charge pump voltage of the device which is greater as VCC;

dimensioning the gate of said NMOS transistors made as thick-oxide MOS transistors for said Bit Switch transistors by its Width-to-Length ratio $(W/L)_{34}=Y_{34}$;

choosing the gate dimension $(W/L)_{34}=Y_{34}$ of said thick-oxide MOS transistors much smaller than the gate dimension $(W/L)_{12}=Y_{12}$ of said thin-oxide MOS transistors;

choosing said maximum voltage value VBS of said Bit Switch control signal driving the gate of said Bit Switch transistors as high as said maximum gate voltage VPP; and optimizing said maximum voltage value VBS of said Bit Switch control signal within said RAM IC for both, a good write stability and a high write speed.

* * * * *